(12) United States Patent
Lee et al.

(10) Patent No.: US 9,281,343 B2
(45) Date of Patent: Mar. 8, 2016

(54) THIN FILM TRANSISTOR DISPLAY PANEL AND METHOD OF MANUFACTURING THE SAME

(71) Applicant: SAMSUNG DISPLAY CO., LTD., Yongin-si, Gyeonggi-do (KR)

(72) Inventors: Yong-Su Lee, Hwaseong-si (KR); Yoon-Ho Khang, Yongin-si (KR); Se-Hwan Yu, Seoul (KR); Dong-Jo Kim, Yongin-si (KR); Min-Jung Lee, Seoul (KR)

(73) Assignee: SAMSUNG DISPLAY CO., LTD. (KR)

( * ) Notice: Subject to any disclaimer, the term of this patent is extended or adjusted under 35 U.S.C. 154(b) by 176 days.

(21) Appl. No.: 13/761,930

(22) Filed: Feb. 7, 2013

(65) Prior Publication Data

US 2013/0200404 A1    Aug. 8, 2013

(30) Foreign Application Priority Data

Feb. 7, 2012    (KR) ........................ 10-2012-0012334

(51) Int. Cl.
*H01L 27/12* (2006.01)
*H01L 27/15* (2006.01)
*G02F 1/1345* (2006.01)
*G02F 1/1362* (2006.01)

(52) U.S. Cl.
CPC .......... *H01L 27/156* (2013.01); *G02F 1/13458* (2013.01); *G02F 1/136213* (2013.01); *G02F 1/136227* (2013.01); *H01L 27/124* (2013.01); *H01L 27/1244* (2013.01); *H01L 27/1248* (2013.01); *G02F 2001/136295* (2013.01)

(58) Field of Classification Search
CPC .............. H01L 27/124; H01L 27/1244; H01L 27/1248
See application file for complete search history.

(56) References Cited

U.S. PATENT DOCUMENTS

| | | |
|---|---|---|
| 6,259,119 B1 | 7/2001 | Ahn et al. |
| 6,555,420 B1 | 4/2003 | Yamazaki |
| 7,023,021 B2 | 4/2006 | Yamazaki et al. |
| 7,499,119 B2 | 3/2009 | Yasuda |
| 7,795,616 B2 | 9/2010 | Yamazaki et al. |
| 2003/0020847 A1* | 1/2003 | Kim et al. ........................ 349/43 |
| 2008/0174711 A1* | 7/2008 | Jung et al. ........................ 349/46 |
| 2009/0309099 A1* | 12/2009 | Kim et al. ........................ 257/59 |

(Continued)

FOREIGN PATENT DOCUMENTS

| | | |
|---|---|---|
| JP | 06-324350 A | 11/1994 |
| JP | 2005-123438 A | 5/2005 |

(Continued)

OTHER PUBLICATIONS

The Extended European Search Report for European Patent Application No. 13154333.2 dated May 23, 2013.

*Primary Examiner* — Yu Chen
(74) *Attorney, Agent, or Firm* — Cantor Colburn LLP

(57) ABSTRACT

A thin film transistor display panel includes: a gate electrode, a source electrode and a drain electrode which are included in a thin film transistor on a substrate; a data line connected to the source electrode; a pixel link member connecting the drain electrode to a pixel electrode; and a gate pad connected to the gate electrode through a gate line and including a first gate subpad, a second gate subpad and a gate pad link member, in which the pixel link member and the gate pad link member are substantially same in thickness.

10 Claims, 11 Drawing Sheets

(56) References Cited

U.S. PATENT DOCUMENTS

2011/0062433 A1  3/2011  Yamazaki
2011/0084267 A1  4/2011  Yamazaki et al.
2011/0084337 A1  4/2011  Yamazaki et al.
2011/0242443 A1  10/2011 Choi et al.
2014/0145184 A1* 5/2014  Amano ........................ 257/43

FOREIGN PATENT DOCUMENTS

KR  10-2011-0111227      10/2011
WO  WO 2013008403 A1 *  1/2013

* cited by examiner

THIN FILM TRANSISTOR DISPLAY PANEL AND METHOD OF MANUFACTURING THE SAME

This application claims priority to Korean Patent Application No. 10-2012-0012334 filed on Feb. 7, 2012, and all the benefits accruing therefrom under 35 U.S.C. §119, the entire disclosure of which is hereby incorporated by reference.

BACKGROUND (1) Field

The invention relates generally to thin film transistor display panels including thick interconnections such as gate or data lines, and a method of manufacturing the same. More particularly, the invention relates to thin film transistor display panels in which interconnections are relatively thicker than the source and drain electrodes of a thin film transistor, and a method of manufacturing the same.

(2) Description of the Related Art

Screen sizes of display units are becoming larger, such as widths of 60 inches or widths more than 120 inches, according to a customer demand. As screen sizes increase, picture resolutions are steadily going to be higher, for example, high definition ("HD", 1366 pixels×768 pixels), full high definition ("FHD", 1920 pixels×1080 pixels), ultra definition ("UD", 4,000 pixels×2,000 pixels) and super high vision ("SHV", 8,000 pixels×4,000 pixels). For example, such higher resolution display units have been developed for the cinema industry.

SUMMARY

One or more exemplary embodiment of the invention provides a thin film transistor display panel in which gate and data lines are thicker than source and drain electrodes.

One or more exemplary embodiment of the invention also provides a thin film transistor display panel having smaller contact holes by means of link members in the contact holes and connecting elements in different layers of the thin film transistor display panel.

An exemplary embodiments of a thin film transistor display panel includes: a gate line, a gate electrode extended from the gate line, a source electrode and a drain electrode, on a substrate, a thin film transistor including the gate, source and drain electrodes; a data line connected to the source electrode; a pixel electrode connected to the drain electrode; a pixel link member which is between the drain and pixel electrodes and connects the drain and pixel electrodes to each other; and a gate pad connected to the gate electrode through the gate line and including a first gate subpad extended from the gate line, a second gate subpad, and a gate pad link member which is between the first and second gate subpads and connects the first and second gate subpads to each other. Thicknesses of the pixel link member and the gate pad link member are substantially the same.

The pixel link member and the gate pad link member may include a first material, and the data line may include a second material which is the same as the first material.

The source electrode and the drain electrode may include a third material, which is different from the second material.

The second material may be larger than the third material in thickness.

The thin film transistor display panel may further include a flattening layer on the pixel link member and the gate pad link member.

The first gate subpad may be identical to the gate line in material.

The second gate subpad may be identical to the pixel electrode in material.

The second material may include copper (Cu).

The drain electrode and the source electrode may include titanium (Ti) or molybdenum (Mo).

Another exemplary embodiments of a thin film transistor display panel includes: a display area in which an image is displayed and a peripheral portion excluding the display area; a gate pad on a substrate and in the peripheral portion; a gate line elongated from the gate pad in a first direction, in the display area and including a same material as the gate pad; a data line in the display area and elongated in a different direction than the gate line; a capping layer between portions of the gate pad and the gate line, and exposing the gate pad and the gate line; a flattening first insulating layer on the capping layer and exposing the gate pad and the gate line; a second insulating layer on the flattening first insulating layer and on the exposed gate pad and gate line, where a thickness of the second insulating layer is smaller than that of the flattening first insulating layer; and a thin film transistor including a gate electrode which is extended from the gate line and under the second insulating layer, a source electrode which is connected to the data line and a drain electrode which is connected to the pixel electrode.

In the above-described structures of a thin film transistor display panels of the invention, as a data line becomes thicker, the thin film transistor display panel can be enlarged and have a high resolution.

Additionally, contact holes for thin film transistors are formed smaller which permits the thin film transistor display panel including thin film transistors to have a high opening rate or high resolution, and reduce a unit cost for manufacturing the thin film transistor display panel.

The advantages and other features related to the invention will be detailed through the specification described hereinafter.

BRIEF DESCRIPTION OF THE DRAWINGS

The above and other aspects, features and advantages of certain exemplary embodiments of the invention will be more apparent from the following description taken in conjunction with the accompanying drawings, in which.

DETAILED DESCRIPTION

Figure 1:
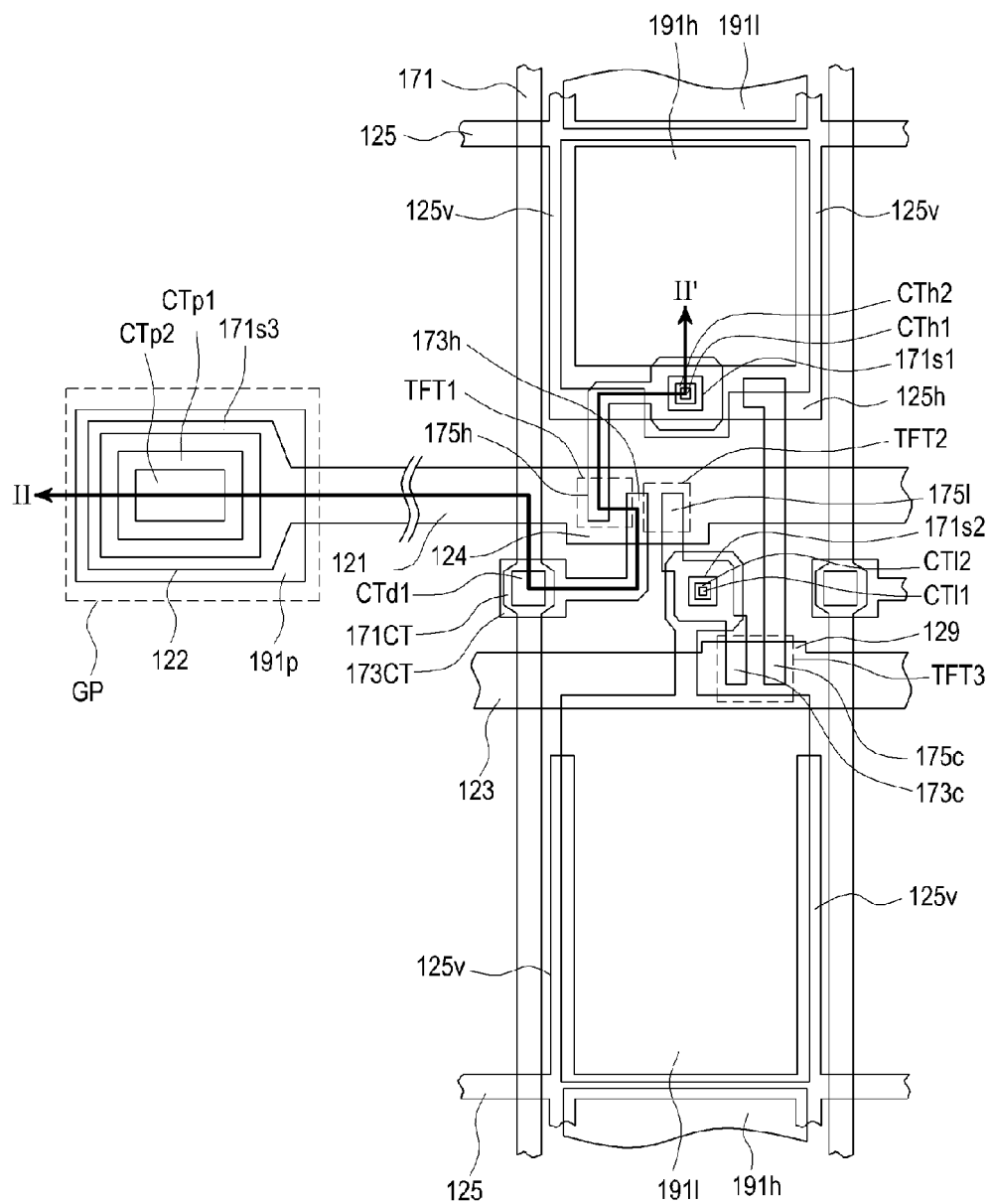
FIG. 1 illustrates a plan view of an exemplary embodiment of a thin film transistor display panel according to the invention.

Exemplary embodiments of the invention will now be described in detail with reference to the accompanying drawings. In the following description, specific details such as detailed configuration and components are merely provided to assist the overall understanding of exemplary embodiments of the invention. Therefore, it should be apparent to those skilled in the art that various changes and modifications of the embodiments described herein can be made without departing from the scope and spirit of the invention. In addition, descriptions of well-known functions and constructions are omitted for clarity and conciseness.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower," "under," "above," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "under" relative to other elements or features would then be oriented "above" relative to the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of stated features, integers, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

A display unit including a display panel having a relative large screen with a corresponding high resolution may experience increased interconnection resistive-capacitive ("RC") delays due to interconnection resistance, and increased parasitic and coupling capacitance. Especially, as a resolution of such a display panel continues to increase, parasitic and coupling capacitance also increases. With an increase of interconnection RC delays, propagation of signals at terminations of interconnections or signal lines can be undesirably prolonged. Where these signals are prolonged, voltage levels decrease, picture quality may be degraded and more power may be consumed in the display panel. Therefore there remains a need for an improved display panel which reduces RC delays.

In order to reduce interconnection resistance, copper (Cu), which has a lower electrical resistance and a higher immunity against electromigration and stress migration than aluminum, is being considered as a material for interconnections and electrodes in a display panel. However, copper (Cu) used as a material for interconnections and electrodes can be undesirably diffused into adjacent circuit elements or semiconductor layers of thin film transistors to deteriorate the characteristics of pixel elements or the thin film transistors of the display panel. Therefore, there remains a need for an improved display panel which reduces or effectively prevents deterioration of the pixel elements or the thin film transistors by diffusion of atoms of a material forming the interconnections.

Moreover, as display panels are developed to have a higher resolutions, opening rates of pixels decrease. With a small pixel opening rate, quality of the display panel and a display unit including the same is undesirably degraded and a cost of manufacturing the display unit becomes expensive. Therefore, there remains a need for an improved display unit having an increased pixel opening rate of pixel.

Hereinafter, the invention will be described in detail with reference to the accompanying drawings.

Figure 2:
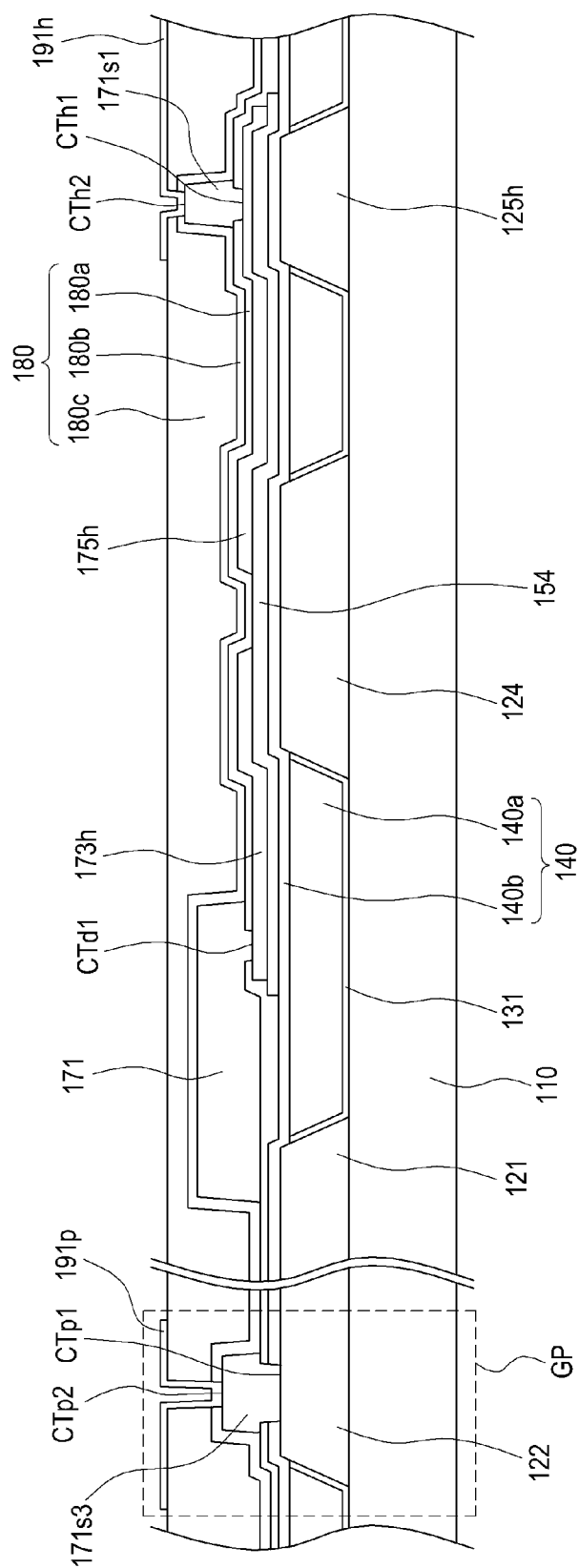
FIG. 2 illustrates a cross-sectional view taken along line II-II' in the thin film transistor display panel of FIG. 1.

Referring to FIGS. 1, 2 and 3A through 3E, an exemplary embodiment of a thin film transistor display panel and a method of manufacturing the same in accordance with the invention will be described. FIG. 1 is a plan view illustrating an exemplary embodiment of a thin film transistor display panel according to the invention. FIG. 2 is a cross-sectional view taken along line II-II' in the thin film transistor display panel of FIG. 1. FIGS. 3A through 3E are cross-sectional views illustrating an exemplary embodiment of a process of manufacturing the thin film transistor display film shown in FIGS. 1 and 2.

An exemplary embodiment of a thin film transistor display panel includes one or more gate line, one or more gate pad connected to the gate line, one or more data line elongated in a different direction than that of the gate line, one or more switching element such as a thin film transistor connected to the gate and data line, and one or more pixels. In FIG. 1, there is shown one gate pad, one gate line connected to the gate pad, a data line elongated vertical to the gate line, thin film transistors connected to the gate line and data line and one pixel. Those artisans skilled in the art will understand that the structure of FIG. 1 is repeated in the thin film transistor display panel to arrange pluralities of gate pads, gate lines, data lines, thin film transistors and pixels therein. The thin film transistor display panel includes a display area in which an image is displayed, and a peripheral (e.g., non-display) area excluding the display area. Portions of the peripheral area may be on opposing sides of the display area, but the invention is not limited thereto or thereby.

The structure of the thin film transistor display panel will be described in detail with reference to FIGS. 1 and 2. In the exemplary embodiment of the thin film transistor display panel shown in FIG. 1, electrodes of the thin film transistor, e.g., source and drain electrodes are smaller in cross-sectional thickness than interconnections, e.g., gate line 121 or a data line 171. Owing to this, signal delays, for example, data signal delays, can be smaller. Furthermore, channels and electrodes of the thin film transistors can be more simply formed in a method of manufacturing the thin film transistor display panel. Since the thin film transistor can be fabricated in a relative small area, an opening rate of a display unit including the thin film transistor display panel is higher. Additionally, as parasitic capacitance with respect to electrodes of the thin film transistor is reduced, it is possible to diminish RC delays along the data line. Therefore, the exemplary embodiment of the thin film transistor display panel can be enlarged to achieve high resolution.

According to the exemplary embodiment of the invention, a material of the data line 171 can be different from that of the electrodes of the thin film transistor. As the electrodes of the thin film transistor include a material with a low diffusion rate and the data line includes a material with low resistance, the thin film transistor becomes more reliable and data signal delays are reduced.

Additionally, at contact holes CTh1, CTl1 and CTp1 are disposed link members 171s1, 171s2 and 171s3 which each have a same material as the data line 171. The link members 171s1, 171s2 and 171s3 may be in and/or on a same layer of the thin film transistor display panel as the data line 171. This permits the contact holes CTh1, CTl1 and CTp1 to be formed smaller, such as in planar dimension and/or area. If the contact holes CTh1, CTl1 and CTp1 have a small dimension at a pixel region of the thin film transistor display panel, an opening rate of the thin film transistor display panel can be raised. Where the contact holes CTh1, CTl1 and CTp1 have the small dimension, the gate pads in a peripheral region can have a relatively small size such as in planar dimension and/or area, and thereby be arranged in a relatively large number. Where the opening rate is raised and there is a relative large number of gate pads of a small dimension in the thin film transistor display panel, it is possible to manufacture a display unit with high resolution.

A gate layer pattern is on a transparent substrate 110 including glass or plastic material. The gate layer pattern may include the gate line 121, a first gate subpad 122, a down gate line 123, a gate electrode 124, a storage electrode line 125 and a down gate electrode 129. The storage electrode line 125 is electrically connected to and continuous with a horizontal storage electrode 125h and vertical storage electrode 125v.

A cross-sectional thickness of the gate layer pattern may be greater than about 1 micrometer (μm), or within a range from about 1 μm to about 4 μm. In an exemplary embodiment of forming the thin film transistor display panel, the gate layer pattern may be formed by means of a sputtering, electroplating ("EP") or electroless plating ("ELP") process. The gate line 121, the first gate subpad 122, the down gate line 123, the gate electrode 124, the storage electrode line 125, the down gate electrode 129, the horizontal storage electrode 125h and the vertical storage electrode 125v of the gate layer pattern are formed in and/or on a same layer of the thin film transistor display panel, As illustrated in FIG. 2, a width of the gate layer pattern taken parallel to the transparent substrate 110 may decrease in a direction away from the transparent substrate 110, such that the gate layer pattern is tapered in the cross-section. To increase the cross-sectional thickness of the gate line 121 and/or to reduce coupling capacitance, a taper angle, e.g., an angle between the transparent substrate 110 and a sidewall of the gate layer pattern, may be from about 60° to about 90°.

The gate layer pattern may include Cr, Mo, Ti, Al, Cu, Ag, or a compound including at least one of those elements. According to one exemplary embodiment of the invention, the gate layer pattern may include a multi-layer structure including a first gate subelectrode (not shown) including titanium (Ti) or a titanic alloy, and a second gate subelectrode (not shown) including copper (Cu) or a copper alloy. In the multi-layer structure, the first gate subelectrode is disposed between the transparent substrate 110 and the second gate subelectrode, and may be thinner than the second gate subelectrode in the cross-section. The function of elements included in the gate layer pattern is disclosed in Korean Patent Publication No. 10-2011-0111227 published at Oct. 10, 2011 and in U.S. Patent Application No. 2011-0242443 published at Oct. 6, 2011, the contents of both of which are incorporated herein by reference in their entireties.

A gate pad GP includes the first gate subpad 122, a gate pad link member 171s3 and a second gate subpad 191p. The second gate subpad 191p included in the gate pad GP receives, for example, an on or off signal from an external source (not shown) and transfers the on or off signal to the gate line 121. According to the exemplary embodiment of the invention, the gate pad GP may be disposed out of a pixel area which includes circuit portions for generating and transferring a gate signal toward the gate line 121 from two or more signals. The pixel area may be in the display area of the thin film transistor display panel.

A first capping layer 131 is on sidewalls of the gate layer pattern. A cross-sectional thickness of the first capping layer 131 may be within a range from about 200 angstroms (Å) to about 1,000 Å. The first capping layer 131 can reduce a diffusion rate of a material of the gate layer pattern, e.g., copper. If a material of the gate layer pattern is diffused out of the gate layer pattern, a reliability of the thin film transistor and/or the thin film transistor display panel is decreased. The first capping layer 131 may not be disposed on an upper surface of the gate layer pattern. A material of the first capping layer 131 may include silicon nitrides (SiNx) or silicon oxides (SiOx), but is not limited thereto or thereby.

A gate insulating layer 140 is on the first capping layer 131. According to the exemplary embodiment of the invention, the gate insulating layer 140 includes a double layer structure including a first gate subinsulating layer 140a and a second subinsulating layer 140b. The first gate subinsulating layer 140a is disposed to contact the first capping layer 131. The second gate subinsulating layer 140b is disposed on the first gate subinsulating layer 140a, on surfaces of the gate layer pattern exposed by the first gate subinsulating layer 140a and the first capping layer 131, and on sidewalls adjacent to the exposed surfaces of the gate layer pattern.

The first gate subinsulating layer 140a planarizes an uneven surface created by the gate layer pattern. A cross-sectional thickness of the first gate subinsulating layer 140a is smaller than that of the gate layer pattern.

According to the exemplary embodiment of the invention, the first capping layer 131 and the first gate subinsulating layer 140a may be at a level lower than that of the gate layer pattern, e.g., the gate electrode 124. That is, a distance respectively between an uppermost surface of the first capping layer 131 and the first gate subinsulating layer 140a, and the transparent substrate 110 (e.g., a height), is smaller than a distance between an uppermost surface of the gate layer pattern and the transparent substrate 110. Where the first capping layer 131 and the first gate subinsulating layer 140a have smaller heights than that of the gate layer pattern, uniform insulation is provided between the gate electrode 124 of the gate layer pattern, and the source and/or drain electrode of the thin film transistor. Since the uniform insulation between the gate electrode 124, and the source and/or drain electrodes causes capacitance to be equalized among the electrodes, operative characteristics in the thin film transistors are also uniform. Consequently, a display unit including the thin film transistor display panel can display high quality images.

The second gate subinsulating layer 140b may contact the gate layer pattern, such as a top surface of the gate layer patterns. A cross-sectional thickness of the second gate subinsulating layer 140b may be within a range from about 2,000 Å to about 5,000 Å.

One of the layers of the double layer structure of the gate insulating layer 140 may be an organic insulator, while the other layer may be an inorganic insulator. In an exemplary embodiment, a material of the first gate subinsulating layer 140a may be an organic insulator, and a material of the second gate subinsulating layer 140b may be silicon nitride (SiNx) or silicon oxide (SiOx). The inorganic insulator may include silicon nitride (SiNx), silicon oxide (SiOx), titanium oxide (TiOx), aluminum (aluminum oxide; $Al_2O_3$), polysilioxane, phenyldiloxane or zirconia (zirconium oxide; $ZrO_2$).

A semiconductor layer 154 is on the second gate subinsulating layer 140b. A plane shape of the semiconductor layer 154 is similar to that of source electrodes 173h and 173c and the drain electrodes 175h, 175l and 175c. According to the exemplary embodiment of the invention, the semiconductor layer 154 may be interposed between the first source electrode 173h and the first drain electrode 175h, and overlapping the first source electrode 173h and the first drain electrode 175h. The semiconductor layer 154 may be interposed between the first source electrode 173h and the second drain electrode 175l, and overlapping the first source electrode 173h and the second drain electrode 175l. The semiconductor layer 154 may be interposed between the third source electrode 173c and the third drain electrode 175c, and overlapping the third source electrode 173c and the third drain electrode 175c. The semiconductor layer 154 overlaps with the gate electrode 124. The semiconductor layer 154 may overlap the horizontal storage electrode 125h. The semiconductor layer 154 may include hydrogenized amorphous silicon, polysilicon or a semiconductor oxide. The semiconductor oxide may include indium gallium zinc oxide ("InGaZnO"), zinc tin oxide ("ZTO") and indium tin oxide ("IZO"). As the semiconductor oxides have high effective mobility, large scale display panels using such materials may have high resolution.

On the semiconductor layer 154, the source electrodes 173h and 173c and the drain electrodes 175h, 175l and 176c are arranged isolated from each other, that is, separated from each other in the plan view. A first thin film transistor TFT1 includes the first source electrode 173h and the first drain electrode 175h. A second thin film transistor TFT2 includes the first source electrode 173h and the second drain electrode 175l. A third thin film transistor TFT1 includes the third source electrode 173c and the third drain electrode 175c. The second drain electrode 175l is continuous with and electrically connected to the third source electrode 173c. The second drain electrode 175l may include a same material as that of the third source electrode 175c.

A channel of the first thin film transistor TFT1 corresponds to a portion of the semiconductor layer 154 exposed between the first source electrode 173h and the first drain electrode 175h. A channel of the second thin film transistor TFT2 corresponds to a portion of the semiconductor layer 154 exposed between the first source electrode 173h and the second drain electrode 175l. A channel of the third thin film transistor TFT3 corresponds to a portion of the semiconductor layer 154 exposed between the third source electrode 173c and the third drain electrode 175c. These channels of the thin film transistors are regions through which charges move when the thin film transistors are operated, e.g., turned on.

According to the exemplary embodiment of the invention, the cross-sectional thickness of each of the source electrodes 173h and 173c and the drain electrode 175h, 175l and 175c may be within a range from about 200 Å to about 3,000 Å. As the thickness of the source and drain electrodes decreases, dimensions of the channels of the thin film transistor, such as a length thereof, can be smaller and made uniform. Smaller channels of the thin film transistor can increase an opening rate of the thin film transistor display panel. Where a larger thickness of the source and drain electrodes can make taper angles and etching states of the electrodes uneven, channel lengths of the transistors can become irregular such that image quality of the thin film transistor display panel is degenerated.

According to the exemplary embodiment of the invention, the material of the source electrodes 173h and 173c and the drain electrodes 175h, 175l and 175c may be a material that does not undesirably vary the electrical characteristics of the semiconductor layer 154 by diffusion or electromigration. The material of the source and drain electrodes can be different from a material of the data line 171. According to the exemplary embodiment of the invention, the source and drain electrodes may include gallium zinc oxide ("GZnO"), aluminum (Al), molybdenum (Mo), titanium (Ti) or manganese (Mn). According to the exemplary embodiment of the invention, the source and drain electrodes may include a single layer structure, a double layer structure or a triple layer structure. The single layer structure may include molybdenum (Mo) layer, the double layer structure may include a manganese (Mn) layer on a gallium zinc oxide (GaZnO) layer which contacts the semiconductor layer 154, and the triple layer structure may include an aluminum (Al) layer between molybdenum (Mo) layer elements.

A first end of the first source electrode 173h overlaps the data line 171 and is connected to the data line 171 through a first data contact hole CTd1. A first end of the first drain electrode 175h is connected to a primary pixel link member 171s1 through a first primary pixel subcontact hole CTh1. The second drain electrode 175l and the third source electrode 173c is connected to a secondary pixel link member 171s2 through a first secondary pixel subcontact hole CTl1. A first end of the third drain electrode 175c overlaps the down gate line 123 and a second end of the third drain electrode 175c opposing the first end overlaps a primary pixel electrode 191h. According to the exemplary embodiment of the invention, the data line 171, the primary pixel link member 171s1 and the secondary pixel link member 171s2 include the same material, and may be in and/or on a same layer of the thin film transistor display panel.

A protecting layer 180 is disposed on the gate insulating layer 140, the semiconductor layer 154, the source electrodes 173h and 173c and the drain electrodes 175h, 175l and 175c. The protecting layer 180 may include two or more subprotecting layers. According to the exemplary embodiment of the invention, the protecting layer 180 includes a first subprotecting layer 180a, a second subprotecting layer 180b and a third subprotecting layer 180c. The first subprotecting layer 180a contacts the semiconductor layer 154. The first subprotecting layer 180a may contact the gate insulating layer 140.

The first subprotecting layer 180a may include titanium oxide ($TiO_2$), aluminum ($Al_2O_3$), zirconia (zirconium oxide; $ZrO_2$), silicon oxide (SiOx) or silicon nitride (SiNx). The first subprotecting layer 180a including silicon nitride (SiNx) can repress precipitation by reduction of oxide of the semiconductor layer 154, or compositional variation in the semiconductor layer 154. A cross-sectional thickness of the first subprotecting layer 180a may be within a range from about 300 Å to about 5,000 Å. In the first protecting layer 180a are defined the first primary pixel subcontact hole CTh1, the first secondary pixel subcontact hole CTl1, the first data contact hole CTd1 and a first gate pad subcontact hole CTp1.

A data layer pattern is on the first protecting layer 180a and in the contact holes CTh1, CTl1, CTd1 and CTp1 defined in the first subprotecting layer 180a. The data layer pattern includes the primary pixel link member 171s1, the secondary pixel link member 171s2, a gate pad link member 171s3 and the data line 171. A material of the data layer pattern is characterized by low electrical resistance. Cross-sectional thicknesses and materials of respective patterns included in the data layer pattern are substantially the same. The respective patterns of the data layer pattern may be in and/or on a same layer of the thin film transistor display panel.

Thicknesses of the data layer pattern may be the same as those of the gate layer pattern, e.g., within a range from 1 about μm to about 4 μm. Materials of the data layer pattern may be the same as those of the gate layer pattern, e.g., copper; Cu, but the invention is not limited thereto or thereby. The thickness of the data layer pattern may be about four times larger than that of the source and drain electrodes. The thickness of the data layer pattern may be different from that of the source and drain electrodes, or the data layer pattern may include a different material than that of the source and drain electrodes. The display unit including the thin film transistor display panel with such a structure can advantageously reduce signal delays and provide a high resolution. Moreover, reliability of the display unit can be improved.

The data line 171 is disposed in the first data contact hole CTd1 and transfers an image signal to the thin film transistor from an external source. A material of the data line 171 is characterized by lower resistance than that of the source and drain electrodes, and a thickness of the data line 171 is larger than that of the source and drain electrodes, so parasitic capacitance thereof can be reduced to lessen data signal delays. According to the exemplary embodiment of the invention, the primary pixel link member 171s1, the secondary pixel link member 171s2 and the gate pad link member 171s3 can each connect lower metal layers of the thin film transistor display panel with upper metal layers, in a stable geometry. Since a larger thickness of the data line 171 results in deeper contact holes, the link members 171s1, 171s2 and 171s3 can reinforce electrical connectivity of the metal layers.

Where the primary pixel link member 171s1, the secondary pixel link member 171s2 and the gate pad link member 171s3 connect lower metal layers of the thin film transistor display panel with upper metal layers, the contact holes CTh2, CTl2 and CTp2 through which connection is provided can be smaller in planar area. If the second primary pixel subcontact hole CTh2 or the secondary pixel subcontact hole CTl2 to be described later becomes smaller in area, an opening rate of the thin film transistor display panel can be increased. Thus, the transmittance of the display unit including the thin film transistor display panel can be raised to enhance the image quality thereof. As a narrower area of the second gate pad subcontact hole CTp2 permits the gate pad GP to be smaller in the plan view, the display unit including the thin film transistor display panel can be manufactured with higher resolution.

In and on the first primary pixel subcontact hole CTh1 is also provided the patterned primary pixel link member 171s1. The primary pixel link member 171s1 is electrically connected to the primary pixel electrode 191h through the second primary pixel subcontact hole CTh2 defined in the second subprotecting layer 180b. The primary pixel link member 171s1 can reinforce the electrical connectivity between the first drain electrode 175h and the primary pixel electrode 191h.

The patterned secondary pixel link member 171s2 is in and on the first secondary pixel subcontact hole CTl1. The secondary pixel link member 171s2 is electrically connected to a secondary pixel electrode 191l through the second secondary pixel subcontact hole CTl2. The secondary pixel link member 171s2 can reinforce the electrical connectivity between the second drain electrode 175l and a secondary pixel electrode 191l.

The patterned gate pad link member 171s3 is in and on the first gate pad subcontact hole CTp1. The gate pad link member 171s3 is electrically connected to the second gate subpad 191p through the second gate pad subcontact hole CTp2. The gate pad link member 171s3 may reinforce the electrical connectivity between the first gate subpad 122 and the second gate subpad 191p. The first gate pad subcontact hole CTp1 is defined in the gate insulating layer 140 and in the first protecting layer 180a. The gate pad link member 171s3 is electrically connected to the first gate subpad 122.

The second subprotecting layer 180b is on the data layer pattern or the first subprotecting layer 180a. The second subprotecting layer 180b covers the data layer pattern but does not cover the contact holes. That is, the second subprotecting layer 180b exposes the contact holes. The second subprotecting layer 180b covering the data layer pattern can lessen diffusion of a material of the data layer pattern such as copper. By this, the second subprotecting layer 180b contributes to improving the reliability of the display unit. A cross-sectional thickness of the second subprotecting layer 180b may be within a range from about 200 Å to about 1,000 Å. The second subprotecting layer 180b may include silicon oxide (SiOx) or silicon nitride (SiNx).

The third subprotecting layer 180c is on the second subprotecting layer 180b. The third subprotecting layer 180c planarizes an upper surface of the underlying layers. According to the exemplary embodiment of the invention, the third subprotecting layer 180c may cover the relatively thick data line 171 which is used to drive the display unit having high resolution and a relatively large size. The third subprotecting layer 180c may include polysiloxane, phenylsiloxane, polyimide, silsesquioxane, silane or an organic insulator. According to an exemplary embodiment of the invention, the third subprotecting layer 180c may be a color filter or include a color filter material.

The second primary pixel subcontact hole CTh2, the second secondary pixel subcontact hole CTl2 and the second gate pad subcontact hole CTp2 are defined in the second subprotecting layer 180b and the third subprotecting layer 180c to open the subprotecting layers 180b and 180c. By way of the subcontact holes CTh2, CTl2 and CTp2, the metal patterns in different layers of the thin film transistor display panel are electrically connected as stated above. Where the primary pixel link member 171s1, the secondary pixel link member 171s2 and the gate pad link member 171s3 connect lower metal layers of the thin film transistor display panel with upper metal layers, the second primary subcontact hole CTh2, the second secondary subcontact hole CTl2 and the second gate pad subcontact hole CTp2 can be small in planar dimensions such as widths. By this, transmittance and image quality of the thin film transistor display panel can be improved. Furthermore, processibility and resolution of the thin film transistor display panel can be enhanced.

A pixel electrode layer is on the protecting layer 180. This pixel electrode layer pattern includes a pixel electrode 191 and the second gate subpad 191p. The pixel electrode layer pattern may include a transparent material such as an indium tin oxide ("ITO") or indium zinc oxide ("IZO"), such as in a film type structure. The pixel electrode layer may include the primary pixel electrode 191h, the secondary pixel electrode 191l and the second gate subpad 191p each completely covering the respective contact holes formed thereunder. The primary pixel electrode 191h, the secondary pixel electrode 191l and the second gate subpad 191p may be in and/or on a same layer of the thin film transistor display panel.

The second gate subpad 191p is electrically connected to the first gate subpad 122 through the first gate pad subcontact hole CTp1 and the second gate pad subcontact hole CTP2. The second gate subpad 191p transfers a scan signal or a gate signal to the gate line 121.

The pixel electrode 191 includes the primary pixel electrode 191h and the secondary pixel electrode 191l. The primary pixel electrode 191h is electrically connected to the first drain electrode 175h through the first primary pixel subcontact hole CTh1 and the second primary subcontact hole CTh2. The secondary pixel electrode 191l is electrically connected to the second drain electrode 175l through the first secondary pixel subcontact hole CTl1 and the second secondary pixel subcontact hole CTl2. The primary pixel electrode 191h receives a first data voltage from the first drain electrode 175h, and the secondary pixel electrode 191l receives a second data voltage lower than the first data voltage from the second drain electrode 175l. The second data voltage applied to the secondary pixel electrode 191l may be lower than the first data voltage applied to the primary pixel electrode 191h by a voltage difference ($\Delta V$). This voltage difference $\Delta V$ can be proportional to capacitance of the third drain electrode 175c.

The primary pixel electrode 191h and the secondary pixel electrode 191l may overlap the storage electrode line 125, the horizontal storage electrode 125h and/or the vertical storage electrode 125v, thereby constituting a storage capacitor. The display unit including the display panel shown in FIGS. 1 and 2 can be worked as disclosed with reference to FIG. 11 of U.S. Patent Publication No. 2011-0242443, published at Oct. 6, 2011, and as disclosed in Korean Patent Publication No. 10-2011-0111227 published Oct. 10, 2011, the contents of both of which are incorporated by reference in their entireties.

A thin film transistor display panel with the above-described structures has high resolution and increased transmittance, and a display unit including this display panel can have high quality.

Figure 3A:
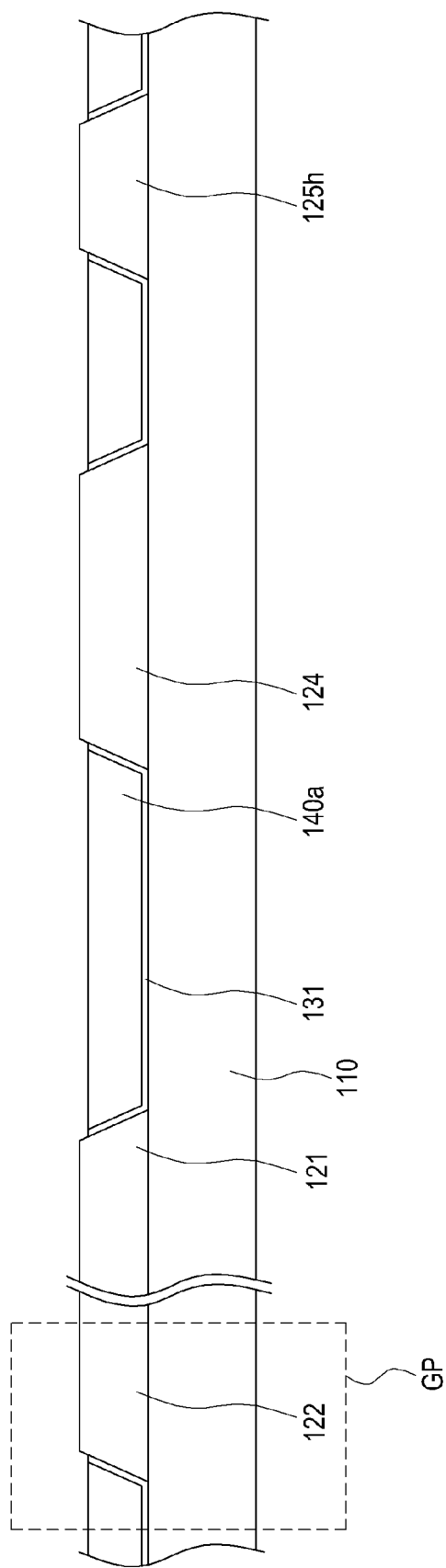
FIGS. 3A through 3E illustrate cross-sectional views for describing an exemplary embodiment of a process of manufacturing the thin film transistor display film shown in FIG. 1, according to the invention.
Figure 3B:
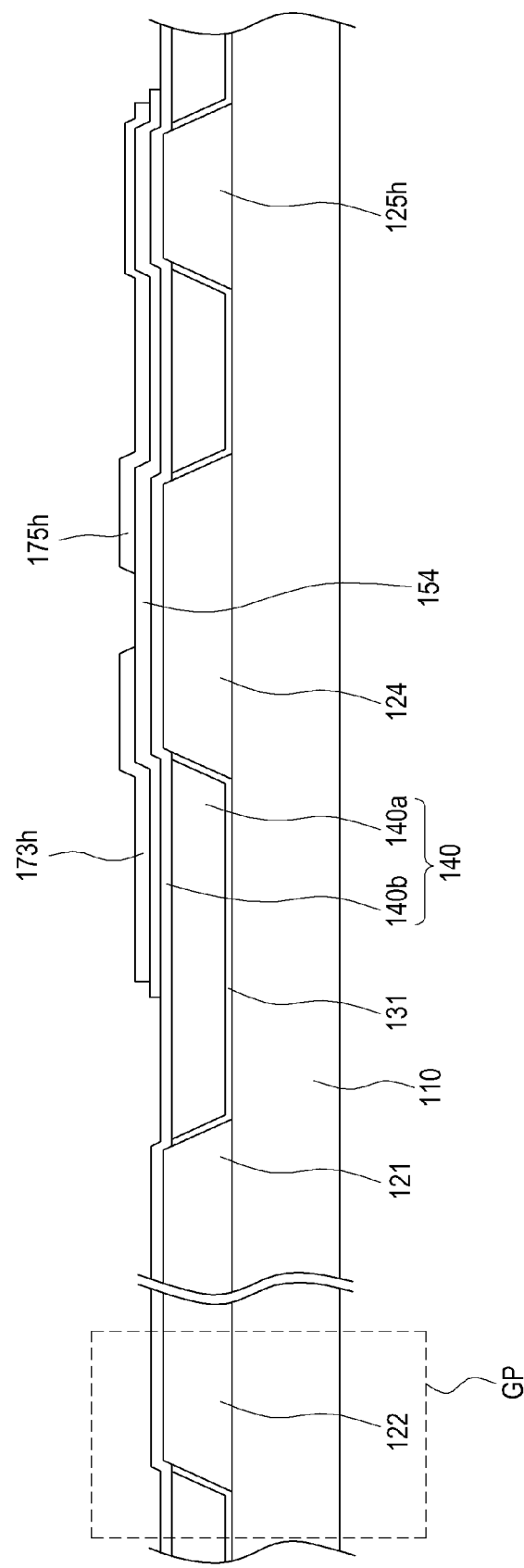
Figure 3C:
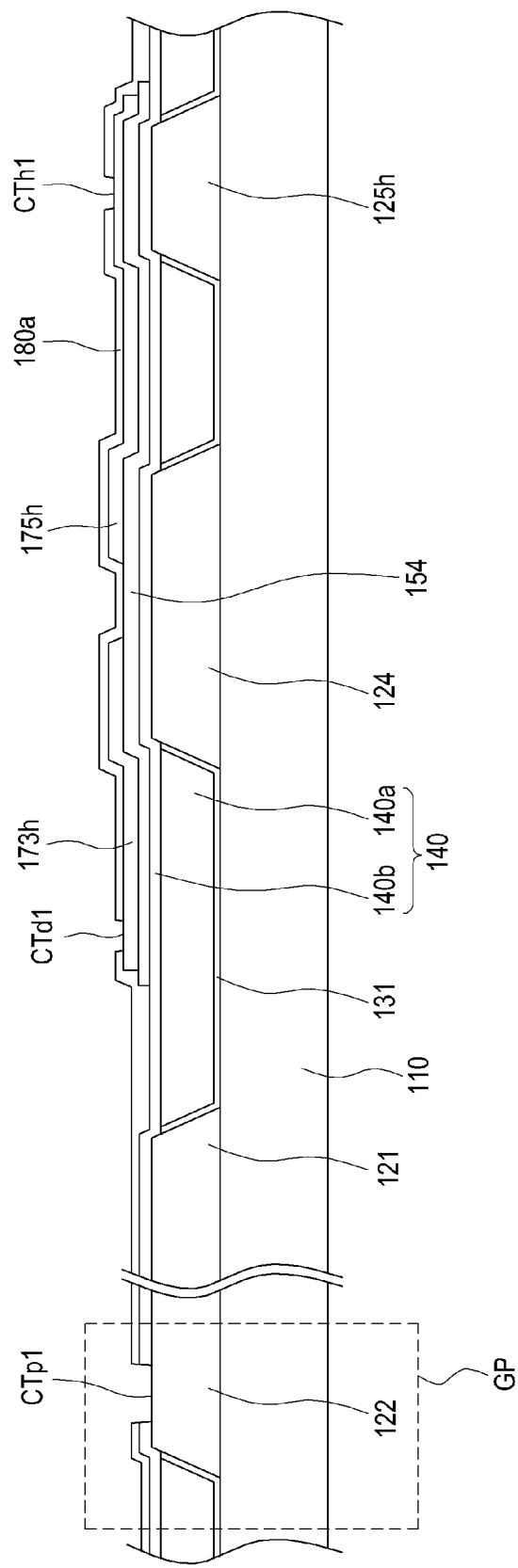

Now a methodological process for manufacturing the thin film transistor display panel shown in FIGS. 1 and 2 will be detailed in conjunction with FIGS. 3A through 3C. FIGS. 2 and 3A through 3E are cross-sectional views illustrating an exemplary embodiment of a method of manufacturing the thin film transistor display panel shown in FIG. 1. Hereinafter, materials or structures explained referring to FIGS. 1 and 2 will be omitted or simply noted in order to obviate unnecessary duplication in explanation.

Referring to FIG. 3A, a conductive material is deposited (e.g., provided) on a transparent substrate 110, a photoresist ("PR") pattern is provided thereon, and the conductive material is selectively etched using the photoresist ("PR") pattern for an etch stop layer, thereby forming the gate layer pattern including the gate line 121, the first gate subpad 122, the gate electrode 124 and the horizontal storage electrode 125h. Using the photoresist pattern as an etch stop layer, the conductive material is partly etched away to form the gate layer pattern of 121, 122, 124 and 125h. The gate line 121, the first gate subpad 122, the gate electrode 124 and the horizontal storage electrode 125h are in and on a same layer of the thin film transistor display panel. The conductive material may include copper (Cu). When a cross-sectional thickness of the gate layer pattern of 121, 122, 124 and 125h is higher than about 1 μm, a taper angle thereof may be one within a range from about 60° to about 90°. According to an exemplary embodiment of the invention, the gate layer pattern of 121, 122, 124 and 125h may include a double layer structure that includes a first gate subelectrode layer including of titanium (Ti) or a titanic alloy, and a second gate subelectrode layer including of copper (Cu) or a copper alloy. The conductive material can be etched by means of etching technology such as dry or wet etching.

On the gate layer pattern of 121, 122, 124 and 125h and the transparent substrate 110, the first capping layer 131 and the first gate subinsulating layer 140a are deposited in sequence. Substantially an entire surface of the first capping layer 131 and the first gate sub insulating layer 140a are etched by a capping layer etching. By way of this capping layer etching, the first gate subinsulating layer 140a is uniformly etched and the first capping layer 131 formed on the gate layer pattern of 121, 122, 124 and 125h can be also etched. For the purpose of forming the gate layer pattern, the first capping layer 131 and the first gate subinsulating layer 140a more evenly, the capping layer etching may proceed until the top of the gate layer pattern of 121, 122, 124 and 125h is exposed. A portion of the sidewall of the gate layer pattern may also be exposed from the first capping layer 131 and the first gate subinsulating layer 140a by the capping layer etching. Hence, the capping layer etching is helpful in effectively flattening the layered surface. According to the exemplary embodiment of the invention, where the first capping layer 131 and the first gate subinsulating layer 140a are not provided on the gate electrode 124, it is possible to uniformly dispose intervals between the gate electrode 124, the first source electrode 173h and the drain first electrode 175h, and therefore the characteristics of the thin film transistors can be stabilized.

When the first gate subinsulating layer 140a includes an organic insulating material, a deposition thickness of the organic insulator material can be uneven relative to when the first gate subinsulating layer 140a includes an inorganic insulating material. For that reason, in order to stabilize the characteristics of the thin film transistors, in an alternative exemplary embodiment of the invention an organic insulating material, which would be formed with uneven thickness on the gate electrode 124, may be omitted, and an inorganic insulating material (e.g. the second gate subinsulating layer 140b), which would be formed with more even thickness, is formed on the gate electrode 124.

Through the capping layer etching to expose the top of the gate layer pattern of 121, 122, 124 and 125h, an upper surface of the first capping layer 131 and the first gate subinsulating layer 140a can be formed lower than that of the gate layer pattern of 121, 122, 124 and 125h. Before etching the first gate subinsulating layer 140a, light irradiated onto a lower surface of the transparent substrate 110 can selectively harden the first gate subinsulating layer 140a by using the gate layer pattern of 121, 122, 124 and 125h as a mask. The capping layer 131 and the first gate subinsulating layer 140a can include a same material as aforementioned.

Referring to FIG. 3B, materials for the second gate subinsulating layer 140b, the semiconductor layer 154, the first source electrode 173h and the first drain electrode 175h are deposited in sequence on the gate layer pattern of 121, 122, 124 and 125h, the first capping layer 131 or the first gate subinsulating layer 140a. These materials and thicknesses thereof are aforementioned and may include any of a number of These materials can be deposited by means of chemical vapor deposition ("CVD") or sputtering.

The semiconductor layer 154, the first source electrode 173h and the first drain electrode 175h are formed using one photoresist mask (not shown). A photoresist film (not shown) is provided on a material of the source electrode 173h and the drain electrode 175h, and then the semiconductor layer 154, the source electrode 173h and the drain electrode 175h can be formed by developing the photoresist film to have a substantially similar pattern to that of the source electrode 173h and the drain electrode 175h. The developed photoresist film forms a photoresist pattern which may be similar to the pattern of the source electrode 173h and the drain electrode 175h except channel regions of the thin film transistors. The photoresist film can be patterned by a mask including slit patterns, lattice patterns or translucent layers. The first source electrode 173h, the first drain electrode 175h and channels of the thin film transistors are formed by conducting an etching process using such a developed photoresist film as a mask. To prevent the second gate subinsulating layer 140b from being effectively etched out, gases having good selectivity with respect to the semiconductor layer 154 and the second gate subinsulating layer 140b may be used.

Referring to FIG. 3C, the first subprotecting layer 180a is deposited on the channels of the thin film transistors, the first source electrode 173h and the first drain electrode 175h of the thin film transistor, and the second gate subinsulating layer 140a. A material and thickness of the first subprotecting layer 180a can be formed as state above. The first subprotecting layer 180a can be formed by means of CVD. A photoresist film is used as a mask to form the first primary pixel subcontact hole CTh1, the first secondary pixel subcontact hole CTl1, the data contact hole CTd1 and the first gate pad subcontact hole CTp1 defined in the first subprotecting layer 180a. During this, the first gate pad subcontact hole CTp1 placed at a portion of the gate pad GP can be further defined in the second gate subinsulating layer 140b.

Figure 3D:
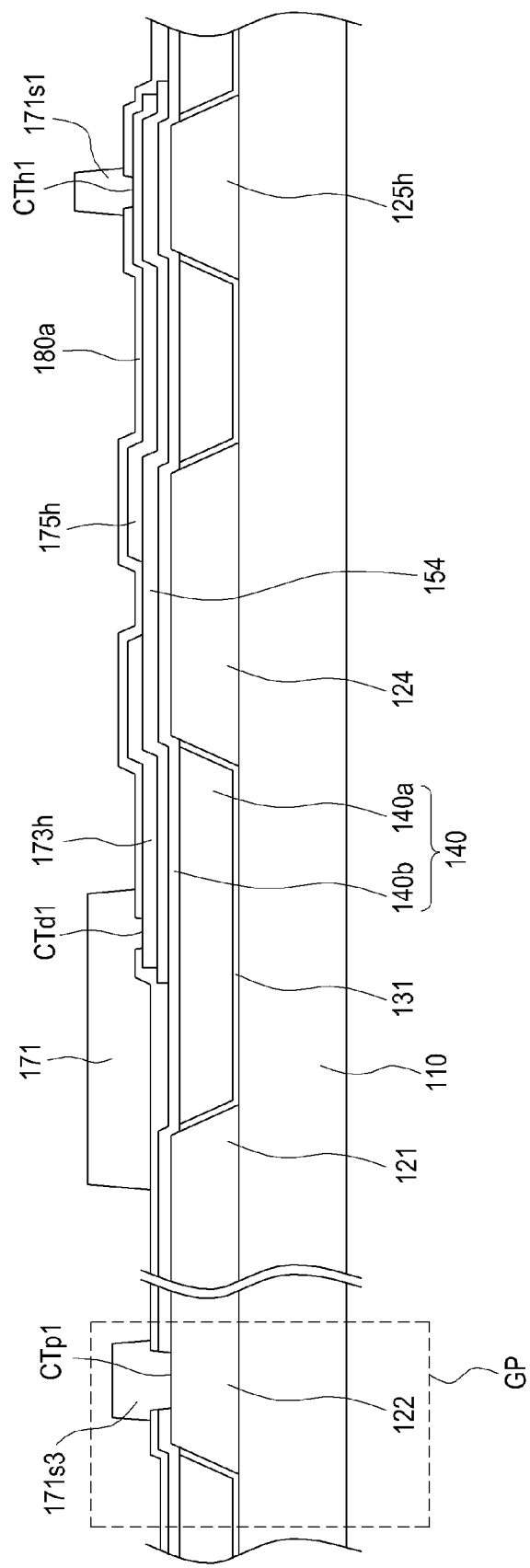

Referring to FIG. 3D, a material for the data layer pattern is deposited in the contact holes CTh1, CTl1, CTd1 and CTp1 and on the first subprotecting layer 180a. The material and thickness for the data layer pattern is same as described above. This data layer pattern can be formed by means of sputtering and electroless plating ("ELP"). The material of the data layer pattern is formed to be the primary pixel link member 171s1, the secondary pixel link member 171s2, the data line 171 and the gate pad link member 171s3 such as by way of photolithography. The primary pixel link member 171s1, the secondary pixel link member 171s2, the data line 171 and the gate pad link member 171s3 are in and on a same layer of the thin film transistor display panel.

The primary pixel link member 171s1 is electrically connected to an end of the first drain electrode 175h of the first thin film transistor TFT1. An end of the first source electrode 173h of the first thin film transistor TFT1 is electrically connected to the data line 171, which is adjacent to the first thin film transistor TFT1, through the first data contact hole CTd1. The secondary pixel link member 171s2 is electrically connected to the second drain electrode 175l and the third source electrode 173c through the second secondary pixel subcontact hole CTl2 at the center of the second drain electrode 175l and the third source electrode 173c. A bottom surface of the gate pad link member 171s3 contacts and is electrically connected to the first gate subpad 122. The primary pixel link member 171s1, the secondary pixel link member 171s2, the data line 171 and the gate pad link member 171s3 have functional effects as stated above in conjunction with FIGS. 1 and 2.

Figure 3E:
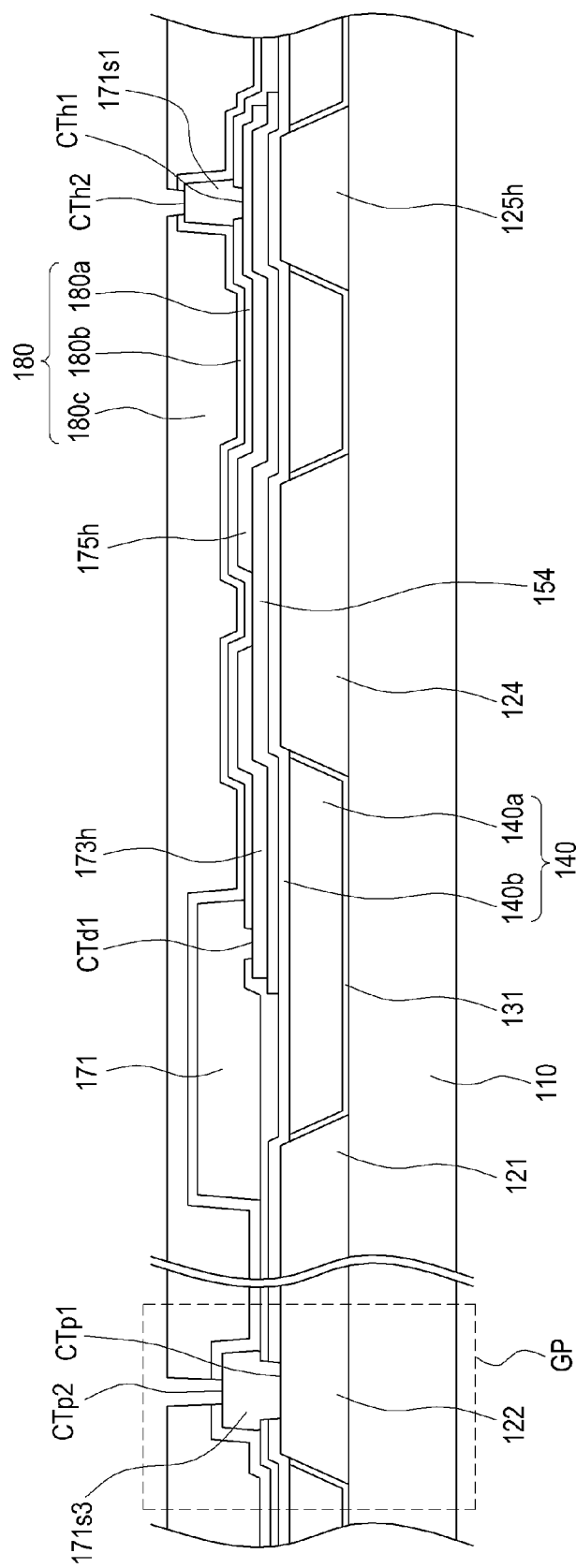

Referring to FIG. 3E, the second subprotecting layer 180b and the third subprotecting layer 180c are deposited in sequence on the first subprotecting layer 180a or the data layer pattern including the primary pixel link member 171s1, the secondary pixel link member 171s2, the data line 171 and the second gate subpad 171s3. Materials and thicknesses for the second subprotecting layer 180b and the third subprotecting layer 180c can be adopted as described above. The second subprotecting layer 180b can be formed by means of CVD and the third subprotecting layer 180c can be formed by means of spin coating or slit casting technique. The third subprotecting layer 180c can be selectively hardened by light and the patterns of the contact holes CTh2, CTl2 and CTp2 can be completed by developing and patterning the third subprotecting layer 180c. The second subprotecting layer 180b can be etched and patterned using the patterned third subprotecting layer 180c as a mask. By way of these developing and etching processes, the contact holes, e.g. the second primary pixel subcontact hole CTh2, the second secondary pixel subcontact hole CTl2 and the second gate pad subcontact hole CTp2, are defined in the second subprotecting layer 180b and the third subprotecting layer 180c. The second primary pixel subcontact hole CTh2, the second secondary pixel subcontact hole CTl2 and the second gate pad subcontact hole CTp2, which are formed above the tops of the primary pixel link member 171s1, the secondary pixel link member 171s2 and the gate pad link member 171s3, can be arranged in a small planar area of the thin film transistor display panel because their planar dimensions are scaled down and their depths are smaller. This effect is described in relation with FIGS. 1 and 2. According to an exemplary embodiment of the invention, the second primary pixel subcontact hole CTh2 may be larger than the first primary pixel subcontact hole CTh1 in planar and/or depth dimensions, but the invention is not limited thereto or thereby. The second secondary pixel subcontact hole CTl2 may be larger than the first secondary pixel subcontact hole CTl1 in planar and/or depth dimensions, but the invention is not limited thereto or thereby.

After then, referring again to FIG. 2, on the third subprotecting layer 180c is formed a pixel electrode layer pattern including the primary pixel electrode 191h, the secondary pixel electrode 191l and the second gate subpad 191p. A material and thickness for the pixel electrode layer pattern may be formed as explained above. This pixel electrode layer can be formed by means of sputtering or CVD. The pixel electrode layer pattern can be completed by photolithography. Respective functions of the pixel electrode layer pattern are as stated above.

By way of the aforementioned exemplary embodiment of the manufacturing method, for example, the pixel contact holes or the gate pad contact holes of a thin film transistor display panel can be formed in small sizes. Therefore, an opening rate of the display unit including the thin film transistor display panel can be increased and the gate pads can be formed smaller. Additionally, the thin film transistor display panel may be fabricated to have a high resolution. Additionally, the aforementioned manufacturing method permits the thin film transistors of the thin film transistor display panel to be formed smaller. By virtue of this arrangement, coupling capacitance can be reduced to render the thin film transistor display panel to have a larger size. Consequently, it is possible to provide a display unit with such a thin film transistor display panel, which is manufactured as described above, having a high image quality.

Figure 4A:
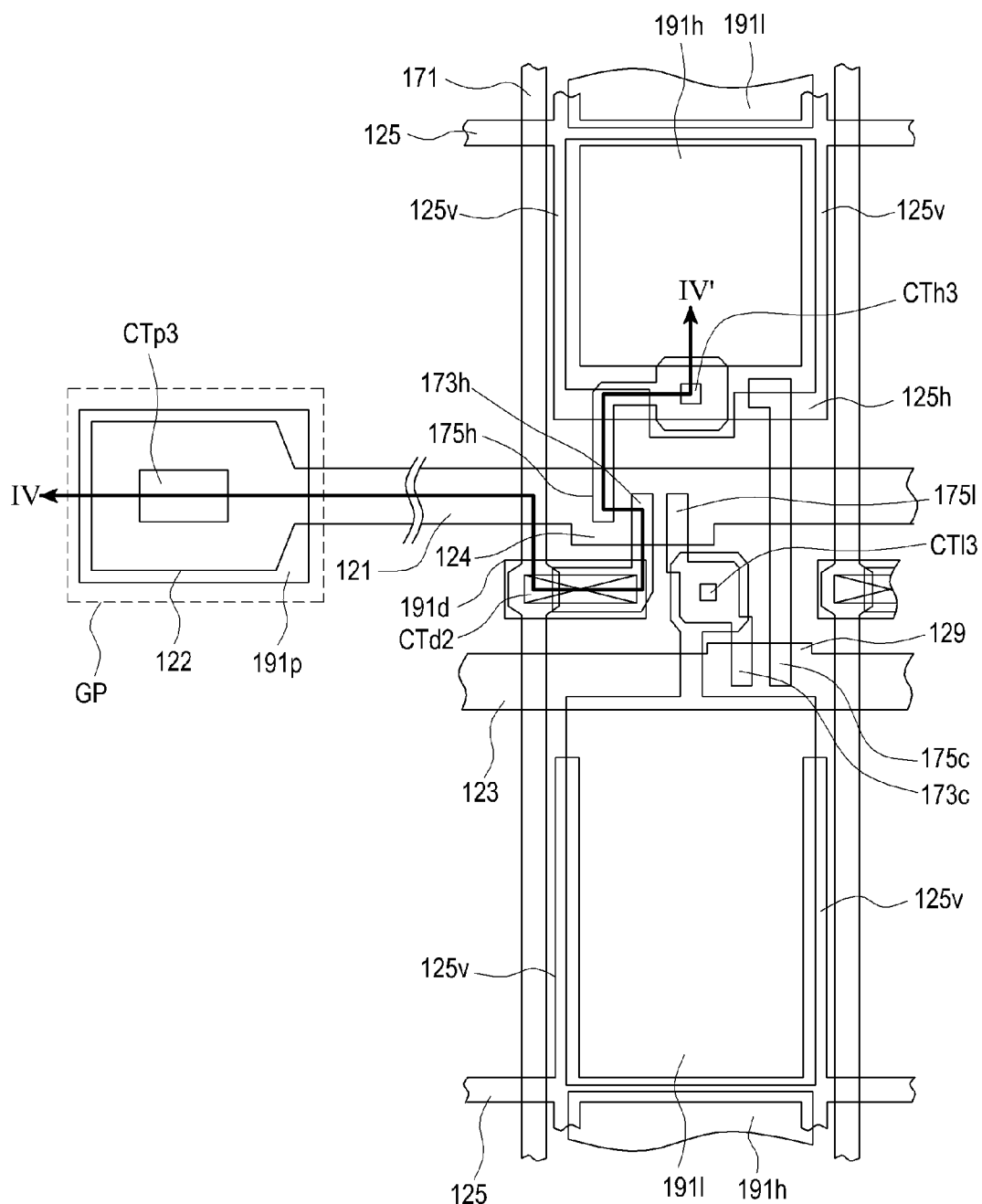
FIG. 4A illustrates a plan view of another exemplary embodiment of a thin film transistor display panel according to the invention.
Figure 4B:
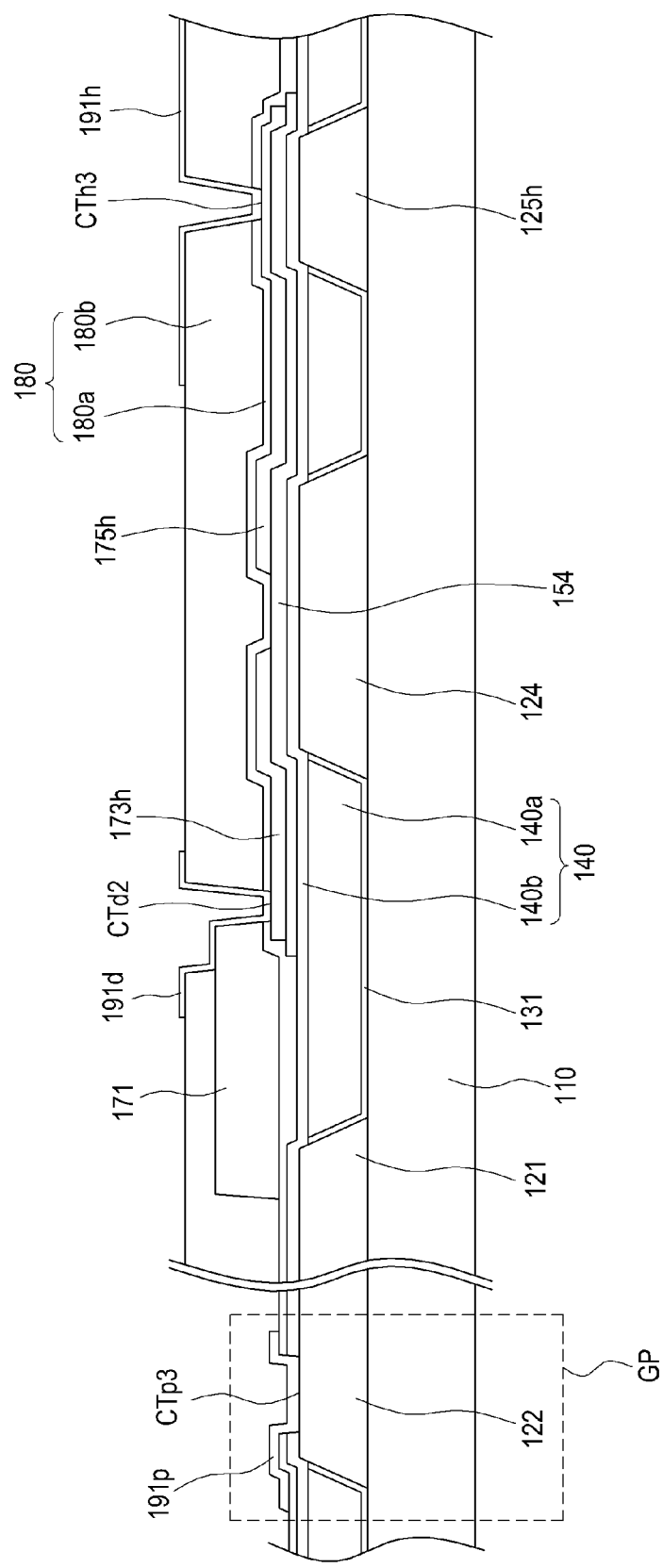
FIG. 4B illustrates a cross-sectional view taken along line IV-IV'" in the thin film transistor display panel of FIG. 4A.

Now referring to FIGS. 4A and 4B, a structure of another exemplary embodiment of a thin film transistor display panel will be described in accordance with the invention. FIG. 4A is a plan view illustrating another exemplary embodiment of a thin film transistor display panel in accordance with the invention. FIG. 4B is a cross-sectional view illustrating line IV-IV' shown in FIG. 4A. According to the exemplary embodiment of the invention, a thin film transistor display panel can be manufactured to have a high resolution and a large size. Additionally, a single data contact hole may be prepared to electrically connect the data line 171 with the first source electrode 173h. By this, it is possible to enhance electrical connectivity thereof and form the contact hole smaller in area. To obviate duplication, hereinafter will be omitted the explanation about materials, structures, and others relevant to the thin film transistors aforementioned referring to FIGS. 1 and 2.

Referring to FIGS. 4A and 4B, as stated above in conjunction with FIGS. 1 through 3B, on the transparent substrate 110 are formed (e.g., provided) the gate line 121, the first gate subpad 122, the down gate line 123, the gate electrode 124, the storage electrode line 125, the down gate electrode 129, the horizontal storage electrode 125h, the vertical storage electrode 125v, the first capping layer 131, the first gate subinsulating layer 140a, the second gate subinsulating layer 140b, the semiconductor layer 154, the source electrodes 173h and 173c, and the drain electrodes 175h, 175l and 175c.

The first subprotecting layer 180a is placed on the gate insulating layer 140, the semiconductor layer 154, the source electrodes 173h and 173c, and the drain electrodes 175h, 175l and 175c.

The data line 171 is formed on the first subprotecting layer 180a. The second subprotecting layer 180b is formed on the data line 171. The second subprotecting layer 180b may include an organic insulating material and flatten the underlying layers. The second data contact hole CTd2, the third primary pixel subcontact hole CTh3 and the third gate pad subcontact hole CTp3 are respectively defined in the gate insulating layer 140 and the protecting layer 180.

The second data contact hole CTd2 is provided to permit the data line 171 to be stably connected with the first source electrode 173h. The second data contact hole CTd2 is defined in the first subprotecting layer 180a and the second subprotecting layer 180b, and overlapping the data line 171 and the first source electrode 173h. According to the exemplary embodiment of the invention, the second data contact hole CTd2 may be expose a side surface of the data line 171. According to the exemplary embodiment of the invention, the data line 171 may overlap the first source electrode 173h.

The third primary pixel subcontact hole CTh3 is defined in the first subprotecting layer 180a and the second subprotecting layer 180b, and overlapping the first drain electrode 175h. The third secondary pixel subcontact hole CT13 is defined in the first subprotecting layer 180a and the second subprotecting layer 180b and overlapping the second drain electrode 175l.

The third gate pad subcontact hole CTp3 is defined in the second gate subinsulating layer 140b and the first subprotecting layer 180a, and overlapping the first gate subpad 122. According to an exemplary embodiment of the invention, the second subprotecting layer 180b can be completely removed in the gate pad region. If the second subprotecting layer 180b is completely removed in the gate pad region, the third gate pad subcontact hole CTp3 can be formed smaller. Therefore as a plurality of smaller gate pads can be formed over the gate pad region, the thin film transistor display panel with this gate pad structure can be used for a high resolution display unit.

Next, a pixel electrode layer pattern is formed on the second subprotecting layer 180b, the second data contact hole CTd2, the third primary pixel subcontact hole CTh3, the third secondary pixel subcontact hole CT13 and the third gate pad subcontact hole CTp3. According to the exemplary embodiment of the invention, this pixel electrode layer pattern may further include a data link member 191d. The data link member 191d is formed and patterned at the second data contact hole CTd2, electrically connecting the data line 171 to the first source electrode 173h. The primary pixel electrode 191h is electrically connected to the first drain electrode 175h through the third primary pixel subcontact hole CTh3. The secondary electrode 191l is electrically connected to the second drain electrode 175l through the third secondary pixel subcontact hole CT13. The second gate subpad 191p is electrically connected to the first gate subpad 122 through the third gate pad subcontact hole CTp3. The thin film transistor display panel with this structure can have high resolution or large size.

Figure 5A:
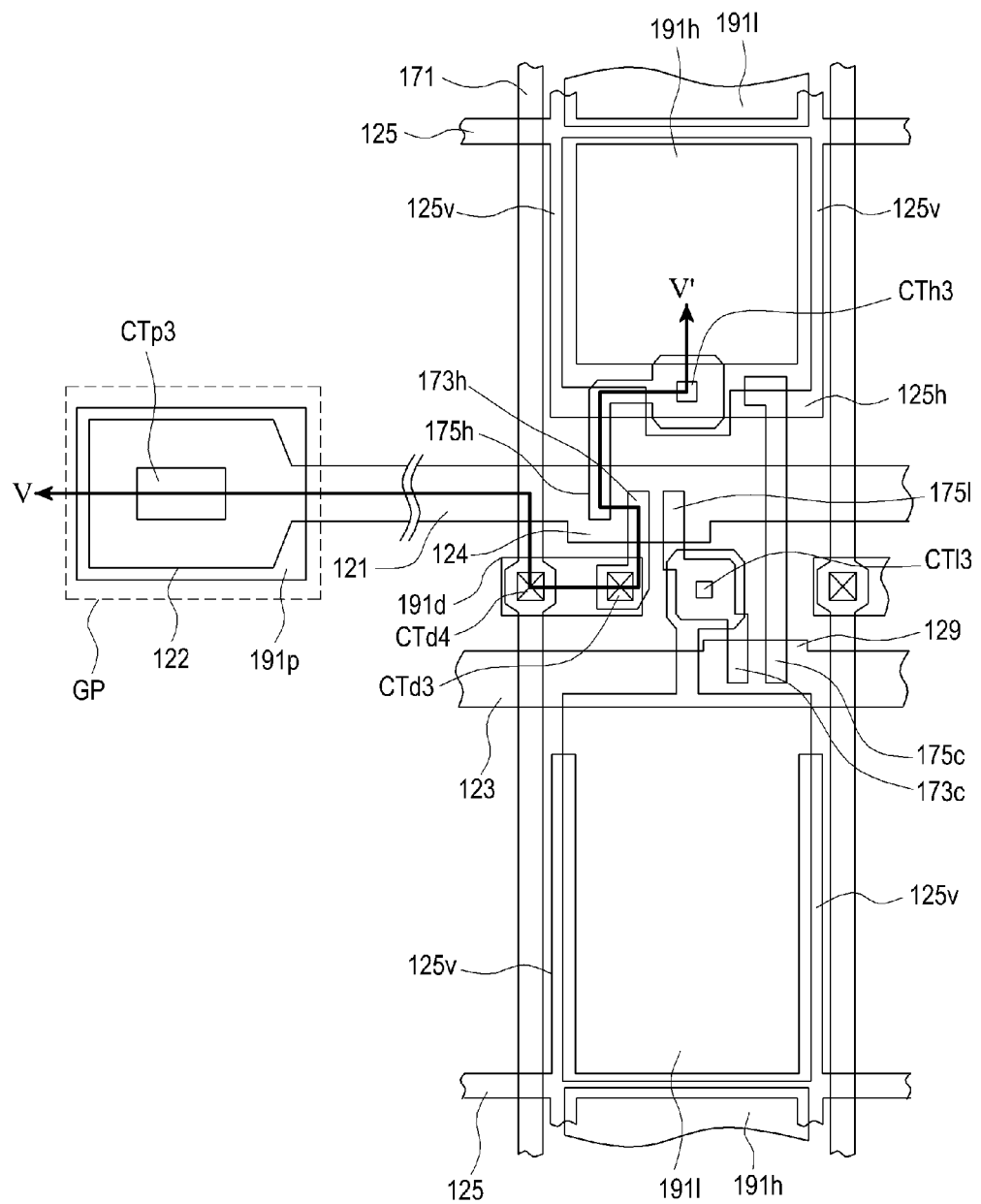
FIG. 5A illustrates a plan view of still another exemplary embodiment of a thin film transistor display panel according to the invention.
Figure 5B:
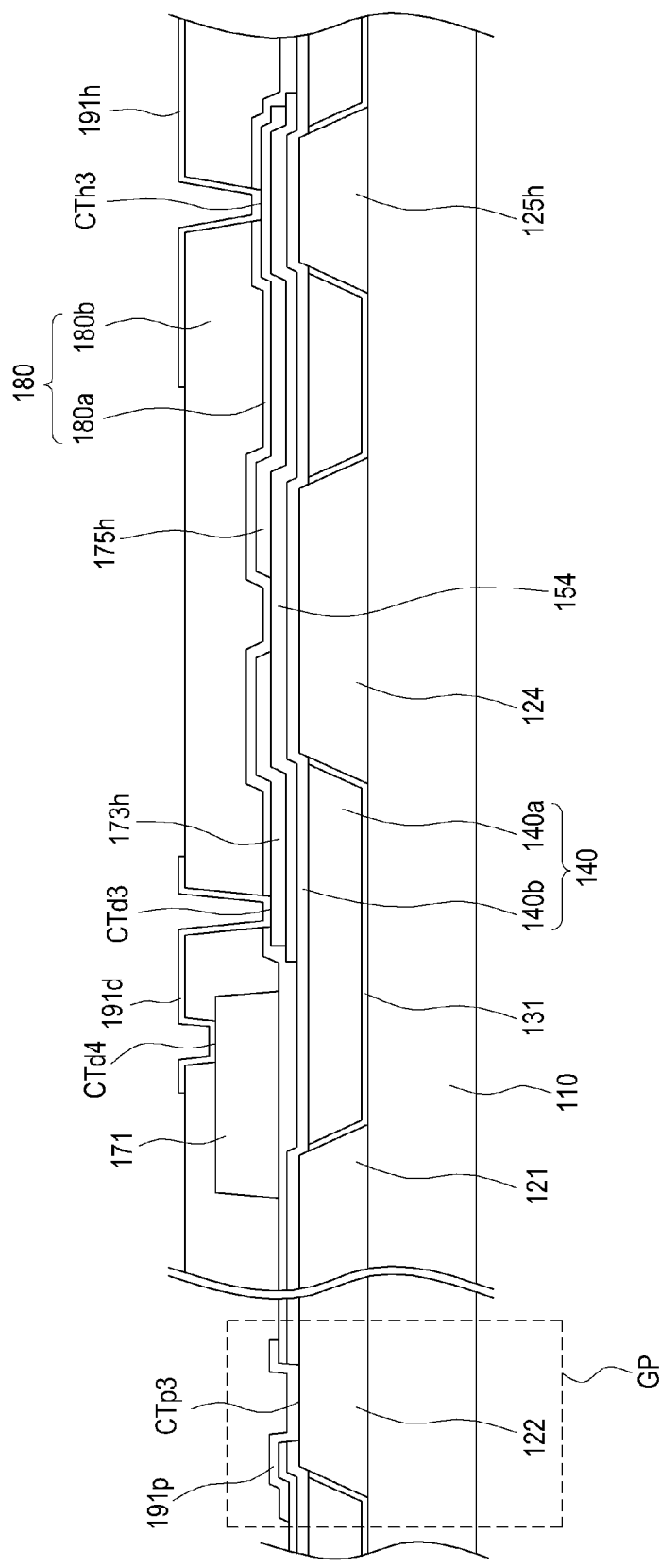
FIG. 5B illustrates a cross-sectional view taken along line V-V' in the thin film transistor display panel of FIG. 5A.

Hereinafter, FIGS. 5A and 5B will be referred to describe a structure of still another exemplary embodiment of a thin film transistor display panel in accordance with the. FIG. 5A is a plan view illustrating still another exemplary embodiment of a thin film transistor display panel in accordance with the invention. FIG. 5B is a cross-sectional view along line V-V' shown in FIG. 5A. According to the exemplary embodiment of the invention, a thin film transistor display panel can be used for a display unit having a high resolution or a large size. Furthermore, as the data line 171 is connected to the first source electrode 173h through the pixel electrode layer pattern, it is effective to lessen parasitic capacitance with respect to the data line 171. Therefore, it is possible to improve the signal delay characteristics of the thin film transistor display panel. The structure illustrated in FIGS. 5A and 5B is substantially similar to that as illustrated relative to FIGS. 4A and 4B, but for the third data contact hole CTd3 and the fourth data contact hole CTd4. Accordingly, the same matters stated relevant to FIGS. 4A and 4B will be omitted hereinafter to obviate unnecessary duplication of description.

Referring to FIGS. 5A and 5B, as aforementioned, on the transparent substrate 110 are formed (e.g., provided) the gate line 121, the first gate subpad 122, the down gate line 123, the gate electrode 124, the storage electrode line 125, the down gate electrode 129, the horizontal storage electrode 125h, the vertical storage electrode 125v, the first capping layer 131, the first gate subinsulating layer 140a, the second gate subinsulating layer 140b, the semiconductor layer 154, the source electrodes 173h and 173c, and the drain electrodes 175h, 175l and 175c, the first subprotecting layer 180a, the data line 171 and the second subprotecting layer 180b.

The a third data contact hole CTd3, a fourth data contact hole CTd4, the third primary pixel subcontact hole CTh3, the third secondary pixel subcontact hole CTl3 and the third gate pad subcontact hole CTp3 are respectively defined in the gate insulating layer 140 and the protecting layer 180.

The third data contact hole CTd3 is defined in the first subprotecting layer 180a and the second subprotecting layer 180b, and overlapping the first source electrode 173h and not overlapping the data line 171. The fourth data contact hole CTd4 is defined in the second subprotecting layer 180b, and overlapping the data line 171 and not overlapping the first source electrode 173h. Unlike FIGS. 4A and 4B, the data line 171 and the first source electrode 173h do not overlap each other in the exemplary embodiment of FIGS. 5A and 5B. The data link member 191d formed at the third contact hole CTd3 and the fourth contact hole CTd4 is electrically connected to the data line 171 and the first source electrode 173h. By this structure, it is possible to reduce parasitic capacitance with respect to the data line 171.

The thin film transistor display panel with this structure can have high resolution or large size.

According to one or more exemplary embodiment of the invention, a thin film transistor display panel has a high resolution and/or a large size.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A thin film transistor display panel comprising:
 a gate line, a gate electrode extended from the gate line, a source electrode and a drain electrode, on a substrate, and a thin film transistor comprising the gate, source and drain electrodes;
 a data line of which a portion crossing the gate line is in a different layer than and connected to the source electrode of the thin film transistor;
 a pixel electrode connected to the drain electrode;
 a pixel link member which is between the drain and pixel electrodes, and connects the drain and pixel electrodes to each other; and
 a gate pad connected to the gate electrode through the gate line, and comprising a first gate subpad extended from the gate line, a second gate subpad, and a gate pad link member which is between the first and second gate subpads and connects the first and second gate subpads to each other,
 wherein
 the pixel link member and the gate pad link member comprise a first material, and the data line portion crossing the gate line comprises a second material which is the same as the first material,
 the source electrode and the drain electrode comprise a third material, which is different from the second material, and
 a thickness of the second material of the data line portion crossing the gate line is larger than a thickness of the third material of the source and drain electrodes.

2. The thin film transistor display panel of claim 1, wherein thicknesses of the pixel link member and the gate pad link member are the same.

3. The thin film transistor display panel of claim 2, further comprising a flattening layer on the pixel link member and the gate pad link member.

4. The thin film transistor display panel of claim 1, further comprising a flattening layer on the pixel link member and the gate pad link member.

5. The thin film transistor display panel of claim 1, wherein the first gate subpad comprises a fourth material, and the gate line comprise a fifth material which is the same as the fourth material.

6. The thin film transistor display panel of claim 1, wherein the second gate subpad comprises a sixth material, and the pixel electrode comprises a seventh material which is the same as the sixth material.

7. The thin film transistor display panel of claim 1, wherein the second material comprises copper (Cu).

8. The thin film transistor display panel of claim 1, wherein the drain electrode and the source electrode comprise titanium (Ti) or molybdenum (Mo).

9. A thin film transistor display panel comprising:
 a display area in which an image is displayed, and a peripheral portion excluding the display area;
 a gate pad on a substrate and in the peripheral portion;
 a gate line elongated from the gate pad in a first direction, in the display area and comprising a same material as the gate pad;
 a data line in the display area and elongated in a different direction than the gate line;
 a capping layer on sidewalls of the gate pad and the gate line, and exposing the gate pad and the gate line, in a plan view,
 a flattening first insulating layer on the capping layer and exposing the gate pad and the gate line,
 wherein from the substrate, a total thickness of the capping layer and the flattening first insulating layer on the capping layer is less than a maximum thickness of the gate pad and is less than a maximum thickness of the gate line;
 a second insulating layer on the flattening first insulating layer, the second insulating layer extending across the exposed gate line to be disposed on the exposed gate pad, wherein a thickness of the second insulating layer is smaller than that of the flattening first insulating layer; and
 a thin film transistor comprising a gate electrode which is extended from the gate line and under the second insulating layer, a source electrode which is connected to the data line, and a drain electrode which is connected to a pixel electrode.

10. The thin film transistor display panel of claim 9, wherein
 the total thickness of the capping layer and the flattening first insulating layer on the capping layer exposes an upper surface and portions of the sidewalls of the gate pad and the gate line, and
 the second insulating layer extending across the exposed gate line to be disposed on the exposed gate pad contacts each of the exposed upper surfaces and each of the exposed portions of the sidewalls of the gate pad and the gate line.

* * * * *